US008862088B2

(12) United States Patent
Kaltiokallio et al.

(10) Patent No.: US 8,862,088 B2
(45) Date of Patent: Oct. 14, 2014

(54) ADJUSTABLE CIRCUIT ARCHITECTURE (75) Inventors: Mikko Kaltiokallio, Espoo (FI); Jussi Ryynanen, Vantaa (FI)

(73) Assignee: Nokia Corporation, Espoo (FI)

( * ) Notice: Subject to any disclaimer, the term of this patent is extended or adjusted under 35 U.S.C. 154(b) by 141 days.

(21) Appl. No.: 13/497,485

(22) PCT Filed: Sep. 22, 2009

(86) PCT No.: PCT/FI2009/050754
§ 371 (c)(1),
(2), (4) Date: Mar. 21, 2012

(87) PCT Pub. No.: WO2011/036331
PCT Pub. Date: Mar. 31, 2011

(65) Prior Publication Data
US 2012/0178391 A1    Jul. 12, 2012

(51) Int. Cl.
H04B 1/10 (2006.01)
H03F 1/32 (2006.01)
H03F 3/19 (2006.01)
H03F 3/45 (2006.01)
H03F 1/34 (2006.01)
H03F 3/191 (2006.01)

(52) U.S. Cl.
CPC ........ *H03F 1/34* (2013.01); *H03F 2203/45522* (2013.01); *H03F 1/3241* (2013.01); *H03F 3/19* (2013.01); *H03F 1/3211* (2013.01); *H03F 2200/411* (2013.01); *H03F 2200/171* (2013.01); *H03F 2203/45631* (2013.01); *H03F 2200/168* (2013.01); *H03F 2203/45544* (2013.01); *H03F 3/45183* (2013.01); *H03F 2200/294* (2013.01); *H03F 2203/45511* (2013.01); *H03F 2203/45512* (2013.01); *H03F 3/45179* (2013.01); *H03F 3/191* (2013.01); *H03F 2203/45528* (2013.01); *H03F 2200/165* (2013.01); *H03F 2203/45638* (2013.01); *H03F 2203/45702* (2013.01)
USPC ......................... 455/307; 455/339

(58) Field of Classification Search
USPC ............... 455/306, 307, 313, 341, 194.2, 339
See application file for complete search history.

(56) References Cited

U.S. PATENT DOCUMENTS 3,843,957 A    10/1974  Vidovic
4,696,055 A *  9/1987  Marshall ........................ 455/118
(Continued)

FOREIGN PATENT DOCUMENTS

CN    1957526 A    5/2007
CN    101478514 A  7/2009
(Continued)

OTHER PUBLICATIONS

Darabi, "A Blocker Filtering Technique for SAW-Less Wireless Receivers", IEEE Journal of Solid-State Circuits, vol. 42, Issue 12, Dec. 2007, pp. 2766-2773.

(Continued)

*Primary Examiner* — Sonny Trinh
(74) *Attorney, Agent, or Firm* — Harrington & Smith (57) ABSTRACT An amplifier circuitry having adjustable parameters is presented. The present amplifier circuitry includes a feed-back loop, wherein the feedback loop converts (26) a signal to another frequency, filters (20) the signal in the other frequency, and restores (24) the filtered signal back to the original frequency for inputting the signal to an input of the amplifier (22). The feed-back loop implements a band-stop filter (20) having an adjustable stopband causing the amplifier circuitry to have an adjustable band-pass response. A passband of the amplifier circuitry is changed from one operating frequency to another operating frequency by changing frequency conversion parameters of the feedback loop.

20 Claims, 3 Drawing Sheets

(56) References Cited

U.S. PATENT DOCUMENTS

| | | | |
|---|---|---|---|
| 4,929,906 | A | 5/1990 | Voyce et al. |
| 4,984,292 | A | 1/1991 | Millen |
| 6,393,260 | B1 | 5/2002 | Murtojarvi et al. |
| 6,901,248 | B1* | 5/2005 | Cowley ............ 455/313 |
| 7,187,230 | B2 | 3/2007 | Vilhonen |
| 7,330,517 | B2 | 2/2008 | Taler et al. ............ 375/297 |
| 7,541,863 | B2 | 6/2009 | Vilhonen |
| 8,126,421 | B2 | 2/2012 | Vaisanen |
| 8,385,871 | B2* | 2/2013 | Wyville ............ 455/280 |
| 8,489,056 | B2* | 7/2013 | Wyville ............ 455/280 |
| 8,526,903 | B2* | 9/2013 | Gudem et al. ............ 455/310 |
| 2006/0262880 | A1 | 11/2006 | Mizuta et al. ............ 375/297 |
| 2006/0276146 | A1 | 12/2006 | Suzuki et al. ............ 455/114.3 |
| 2009/0111418 | A1 | 4/2009 | Darabi |
| 2009/0233568 | A1 | 9/2009 | Zhang et al. |
| 2009/0258615 | A1 | 10/2009 | Capofreddi et al. |
| 2012/0320955 | A1* | 12/2012 | Ueda et al. ............ 375/219 |
| 2013/0149982 | A1* | 6/2013 | Wyville ............ 455/307 |

FOREIGN PATENT DOCUMENTS

| | | |
|---|---|---|
| WO | 8703757 | 6/1987 |
| WO | 2008/000906 A1 | 1/2008 |
| WO | 2008/000907 A1 | 1/2008 |
| WO | 2008/000908 A1 | 1/2008 |
| WO | 2008/074922 A1 | 6/2008 |
| WO | 2009/010735 A1 | 1/2009 |

OTHER PUBLICATIONS

Werth et al., "Active Feedback Interference Cancellation in RF Receiver Front-Ends", IEEE Radio Frequency Integrated Circuits Symposium, Jun. 7-9, 2009, pp. 379-382.

International Search Report and Written Opinion received for corresponding International Application No. PCT/FI2009/050754, dated Jul. 6, 2010, 12 pages.

Supplemental European Search Report and Written Opinion received for corresponding European Application No. EP 09849712, dated Oct. 18, 2013, 7 pages.

* cited by examiner

ADJUSTABLE CIRCUIT ARCHITECTURE

RELATED APPLICATION

This application was originally filed as PCT Application No. PCT/FI2009/050754 filed Sep. 22, 2009.

FIELD

The invention relates to the field of radio telecommunications circuitries and, particularly, to a method and apparatus for improving linearity requirements in an amplifier circuitry.

BACKGROUND

A modern radio telecommunication environment is very diverse with the use of numerous radio communication schemes, both standard and non-standard. User devices may be equipped with capabilities to communicate through multiple different radio communication schemes, e.g. GSM, GPRS/EDGE, Bluetooth, WLAN, UMTS and its evolution versions HSDPA, LTE and LTE-A. Additionally, concepts like cognitive radio or software-defined radio are seen to be implemented in the user devices in near future. Cognitive radio and software-defined radio are general concepts to denote radio devices that are able to sense a radio environment and to select a radio communication scheme and radio communication parameters that are the most suitable for the sensed radio environment.

Support for numerous radio communication schemes operating on different frequency bands sets requirements for radio interface components of the user device. The radio interface components, including analog amplifiers, have to operate linearly over a large frequency band. The linearity requirement on the numerous frequency bands sets challenges to the design of the radio interface components.

BRIEF DESCRIPTION

According to an aspect of the present invention, there is provided an apparatus as specified in claim 1.

According to another aspect of the present invention, there is provided a method as specified in claim 12.

According to another aspect of the present invention, there is provided an apparatus as specified in claim 19.

According to another aspect of the present invention, there is provided an apparatus as specified in claim 20.

According to another aspect of the present invention, there is provided a method as specified in claim 35 and claim 42.

According to another aspect of the present invention, there is provided an apparatus as specified in claim 24 and claim 43.

Embodiments of the invention are defined in the dependent claims.

LIST OF DRAWINGS

Embodiments of the present invention are described below, by way of example only, with reference to the accompanying drawings, in which.

DESCRIPTION OF EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

Figure 1:
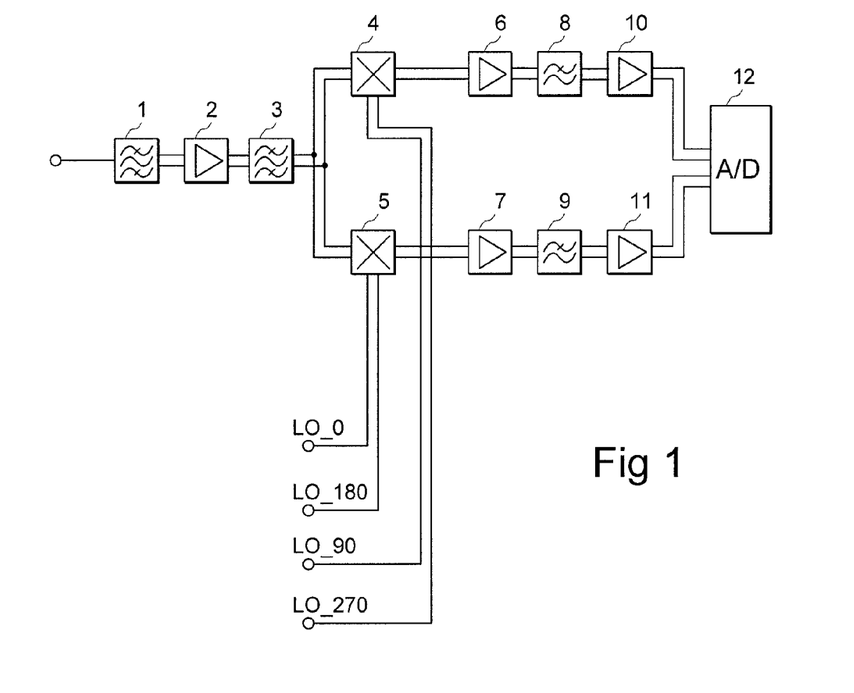
FIG. 1 illustrates a general structure of a radio receiver to which embodiments of the invention may be applied.

FIG. 1 illustrates an example of a direct-conversion receiver architecture for converting a received radio signal to the baseband. The receiver comprises a first amplifier 2 before down-converters 4 and 5. The first amplifier 2 is typically a low-noise amplifier (LNA). Bandpass filters 1 and 3 have been provided before and after the amplifier 2 to remove undesired frequency components. Down-converters 4 and 5 down-convert in-phase (I) and quadrature (Q) components of the received radio signal from a radio frequency (RF) to the baseband with local oscillator signals LO_0, LO_90, LO_180, and LO_270. The number refers to the phase shift of the respective local oscillator signal. After the down-conversion, baseband amplifiers 6 and 7 amplify the down-converted I and Q components, respectively, and low-pass filters 8 and 9 remove harmonic signal components resulting in the down-conversion. Amplifiers 10 and 11 further amplify the low-pass filtered signals before analog-to-digital (A/D) conversion in an A/D-converter 12.

Designing RF circuits and other high-frequency circuits that may be tuned over a wide frequency range has been a challenge for a long time. Limitations arise from basic semiconductor physics: non-idealities of the components limit the degree and quality of tunability that can be achieved. The rise of multi-band and multi-system receivers has emphasized this problem. Such receivers may be used in cognitive radios configured to communicate over multiple radio communication protocols and to select for each application an appropriate radio communication protocol on the basis of detected radio communication environment, frequency band occupation, interference environment, etc. The research effort has transferred toward wideband receiver structures. This has the effect that the receiver circuits have to operate in a more hostile environment, because the receiver front-end components have to deal with not only in-band signals but also out-band signals. This ultimately leads to more stringent linearity requirements that have to be achieved in the circuits. Additionally, modifying the wideband response of a circuit has proven challenging.

The present invention relates to an apparatus comprising an amplifier circuitry comprising an amplifier with a feedback loop circuitry, wherein the feedback loop circuitry implements a band-stop filter having a stopband adjustable to a current operating frequency. A band-stop response of the feedback loop circuitry causes the amplifier circuitry to have a frequency-selective band-pass response selectively for each of a plurality of different operating frequencies, wherein a passband of the amplifier circuitry is located at the current operating frequency.

Figure 2:
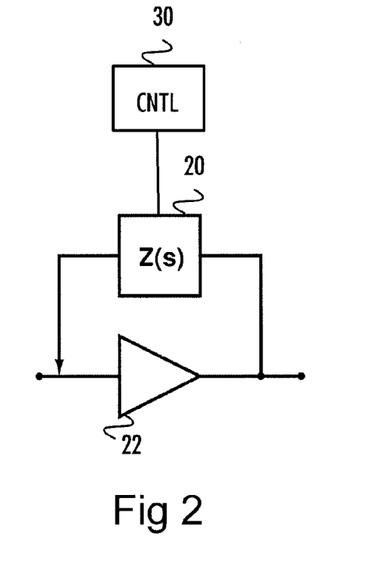
FIG. 2 illustrates a block diagram of an amplifier circuitry and a controller controlling the amplifier circuitry according to embodiments of the invention.

FIG. 2 illustrates an exemplary structure of an analog amplifier circuitry according to an embodiment of the invention. The amplifier circuitry comprises an amplifier 22 that has a feedback loop circuitry comprising filter circuitry 20 with a frequency selective impedance $Z(s)$. With respect to the operation of the amplifier circuitry, let us for illustrative purposes first assume that the impedance Z is very large over the whole frequency range and, thus, the amplifier 22 considers the feedback loop as an open circuit and, as a consequence, the response of the amplifier circuitry is equal to the response of the amplifier 22. Next, let us assume that the frequency selective impedance Z is very large at low frequencies and very small at high frequencies. Now, the system response is determined by both the feedback impedance Z and the amplifier 22. The frequency response of the amplifier circuitry is now low-pass, because the high-pass response of the feedback loop circuitry is subtracted from a frequency response of the amplifier circuitry which may be substantially flat on the operating frequency range.

By creating the frequency-selective impedance Z which is low at all other frequencies except the desired operating frequency, the impedance Z creates a band-stop response which means that a band-pass type of response is obtained for the amplifier circuitry. Effectively, the frequency-selective impedance cancels the desired signal in the feedback loop, leaving undesired signal components (an additionally possibly residuals of the desired signal) that become subtracted from an input signal of the amplifier 22. As a result, interfering signal components are mitigated, which improves the linearity of the amplifier circuitry and any other circuitry following the amplifier circuitry. Because the gain is low outside the operating frequency band, out-band signal components are attenuated and the linearity of the amplifier circuitry improves proportionally to the decreasing gain.

Figure 3A:
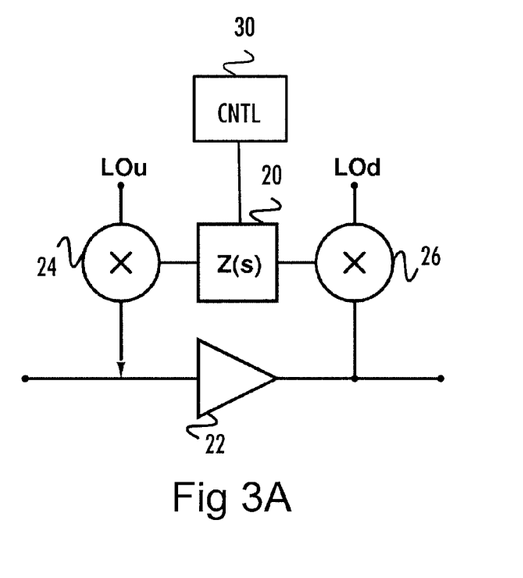
FIG. 3A illustrates another block diagram of an amplifier circuitry and a controller controlling the amplifier circuitry according to embodiments of the invention.

FIG. 3A illustrates another embodiment of the invention. In this embodiment, a feedback signal is first down-converted to the baseband, then filtered and phase-adjusted in the filter circuitry 20 and, before applying the feedback signal to an input of the amplifier 22, the signal is up-converted back to the original frequency. The up-converted, filtered, and phase-compensated feedback signal is then applied to the input of the amplifier 22. In order to carry out the frequency conversion before and after the filter circuitry 20, frequency mixers 24 and 26 are incorporated in both sides of the filter circuitry 20. A down-converter 26 down-converts an output signal of the amplifier 22 input to the feedback loop by using a local oscillator signal LOd having a frequency corresponding to the operating frequency of the amplifier circuitry. The down-converter 26 may be configured to down-convert an RF signal to the baseband. Then, the filter circuitry 20 comprising the high-pass filter and/or the polyphase filter filters and/or phase-compensates the baseband signal received from the down-converter 26 on the baseband and applies the filtered and phase-adjusted baseband signal to the up-converter 24. The up-converter 24 up-converts the filtered and phase-adjusted baseband signal from the baseband back to the RF signal by using another local oscillator signal LOu. In practice, the two local oscillator signals LOd and LOu may have the same frequency and may even originate from the same local oscillator.

Now that the feedback loop comprises the frequency mixers 24 and 26 frequency-converting the signal between the radio frequency band and the baseband, the frequency response of the filter circuitry 20 may be configured as a high-pass response. When the high-pass response of the filter circuitry 20 is up-converted back to the RF, the response appears as a band-stop response, which effectively configures the response of the amplifier circuitry to become a band-pass response. An advantage of using the frequency mixers 24, 26 around the filter circuitry 20 is that the frequency response of the filter circuitry may be kept constant, unless the bandwidth of the response is changed. The passband frequency may be changed simply by changing the frequency of the local oscillator signals LOd and LOu. The frequency of the local oscillator signals LOd and LOu is changed in response to a change in the operating frequency of the amplifier circuitry. A controller 30 or a control circuitry may control the change of the passband frequency by controlling one or more local oscillator signal generators providing the local oscillator signals LOu and LOd to change the oscillating frequency in response to the change in the operating frequency.

Utilization of high-pass type impedance, e.g. a capacitor, in the filter circuitry creates a frequency-selective impedance which resembles an inductor L and a capacitor C connected in parallel to each other. When this band-stop impedance is included in the feedback configuration together with the amplifier 22, a band-pass type system response is created. The difference between the present embodiment of FIG. 3 and the LC impedance is that the band-pass frequency can be altered simply by changing the LO frequency in the present invention, while changing the passband of the LC impedance requires a change in component values of the inductor and/or capacitor. Additionally, the transition bands of the response do not change when the band-pass frequency is changed, contrary to the properties of the LC impedance. This results from the fact that the signal environment between the frequency mixers 24 and 26 may be kept constant from one LO frequency to another, except for the phase-compensation. Another advantageous feature is that the amplifier circuitry is effectively in an open-loop configuration around the passband and, thus, the passband properties of the amplifier circuitry are determined by the amplifier rather than the feedback. Additionally, the amplifier circuitry is inherently wideband due to the choice between multiple operating frequencies and not necessarily dedicated to a use on a given, fixed, and narrow operating frequency band. The multiple different operating frequency bands together form a wide frequency band where the amplifier circuitry can be configured to operate.

Non-idealities of the amplifier 22 and the feedback loop circuitry also affect the operation of the amplifier circuitry. An increase in the operating frequency of the amplifier circuitry creates a phase shift over the feedback loop which causes the pass-band to shift in frequency. The phase shift is different for each operating frequency. The frequency shift increases proportionally to the increase in the phase shift, which implies that very high frequency circuits using this topology might be difficult to implement. According to embodiments of the invention, this problem is solved by adding a polyphase filter having the adjustable phase shift to the feedback loop so as to compensate for the undesired frequency-dependent phase shift phenomenon. The circuit configuration of the polyphase filter is adjusted so as to tune the phase shift of the signal applied to the feedback loop. The circuit configuration of the polyphase filter may be changed under the control of the controller 30 and in response to a change in the operating frequency of an apparatus, e.g. a radio receiver, comprising the amplifier circuitry so that a different phase shift adjustment may be implemented for different operating frequencies. In particular, the controller 30 may change the circuit configuration of the polyphase filter so as to compensate for the pass-band shift when the operating frequency is changed. Additionally, the controller 30 may be configured to tune the frequency response of the filter circuitry 20 in order to implement a band-stop response around the operating frequency, i.e. band-pass response for the amplifier circuitry. The controller 30 may change the circuit configuration of the filter circuitry 20 comprising the polyphase filter in response to the change in the operating frequency. The adjustment of the circuit configuration is described in greater detail below.

Instead of converting an input signal of the feedback loop circuitry to the baseband, the down-converter 26 may convert the input signal to an intermediate frequency which is not baseband. In this case, since an oscillator signal with the same frequency is applied to the frequency mixers 24 and 26, the up-converter 24 up-converts the signal filtered by the filter circuitry from the intermediate frequency back to the radio frequency. In this embodiment, the filter circuitry may be configured to have a band-stop frequency response around a center of the intermediate frequency, i.e. around a frequency defined as the center radio frequency minus the frequency of the local oscillator signal LOu and/or LOd. It can be foreseen that the intermediate frequency, where the filtering is carried out, is higher than the original frequency of the input signal, although typically a lower frequency may be preferred. It should be appreciated that the present invention is not limited to filtering the input signal on the lower frequency.

The filter circuitry 20 may implement the band-stop filter and/or the phase-compensating polyphase filter having their parameters adaptive to the plurality of different operating frequencies. The band-stop filter may be realized by using a dedicated band-stop filter or by using a high-pass filter and the frequency mixers 24 and 26, as in the embodiment of FIG. 3A.

The amplifier circuitry is applicable not only to radio communication devices but also to electronic devices operating on lower operating frequencies, e.g. on frequencies in the order of a few MHz or kHz. In such a case, the down-conversion and up-conversion operations are not necessarily carried out between the radio frequency and the baseband or intermediate frequency but, more generally, between two frequencies (higher and lower frequency).

Figure 3B:
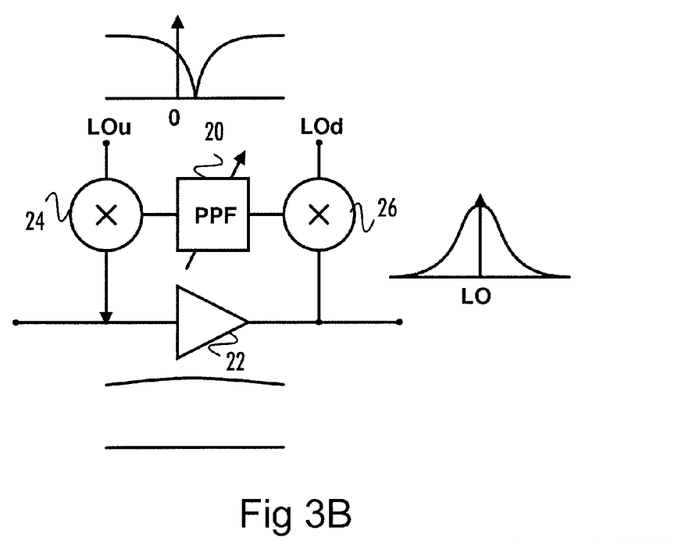
FIG. 3B illustrates the amplifier circuitry of FIG. 3A and frequency responses in different parts of the amplifier circuitry.

FIG. 3B illustrates a circuit configuration of the amplifier circuitry and frequency responses in different parts of the circuitry. The controller 30 is omitted in FIG. 3B for the sake of illustration, but the controller 30 may naturally be included in the circuitry as well. The frequency response of the amplifier 22 is substantially flat, and the response of the filter circuitry 20 is high-pass. The frequency response above the filter circuitry 20 shows the effect of the phase drift caused by the use of different operating frequencies. In particular, the frequency response of the filter circuitry 20 drifts away from the baseband to form a notch on another frequency. The frequency shift and phase drift are compensated for in the polyphase filter comprised in the filter circuitry 20. As a consequence of the compensation, the center frequency of the notch of the feedback loop circuitry remains around the operating frequency, i.e. the frequency of the local oscillator signals LOd and LOu. This has the effect that the center frequency of the passband of the amplifier circuitry also remains around the local oscillator frequency LO (equalling LOd and LOu). As a consequence, the amplifier circuitry has desired passband features on all operating frequencies as illustrated by the frequency response at the output of the amplifier circuitry in FIG. 3B.

The amplifier circuitry may be comprised in a radio communication device supporting radio communication on multiple frequency bands. Such a radio communication device is typically called a multi-mode communication device. As mentioned above, the controller 30 may change the circuit configuration of the filter circuitry according to the current operating frequency of the amplifier circuitry and the radio communication device. In the embodiment using the frequency mixers 24, 26 in the feedback loop circuitry, the controller 30 may control the frequency of the local oscillator signals LOd and LOu applied to the frequency mixers 24, 26. In practice, the controller 30 may control the oscillating frequency of a frequency synthesizer, e.g. a phase-locked loop, or the controller 30 may control the frequency-division of an oscillator signal originating from the frequency synthesizer such that a local oscillator signal having a frequency corresponding to the operating frequency is applied to the frequency mixers 24, 26. Each oscillator signal applied to the frequency mixers 24, 26 may comprise an in-phase signal component and a quadrature signal component so as to enable the frequency shift in the polyphase filter. When the amplifier circuitry is implemented as LNA in a radio receiver, the local oscillator signals LOd and LOu may be the same as those applied to a frequency mixer or mixers, e.g. the mixers 4 and 5 of FIG. 1, down-converting the received radio signal later in the receiver chain. Additionally, the controller 30 may adjust the response of the filter circuitry 20 according to the current operating frequency. In particular, the controller 30 may adjust the phase shift of the polyphase filter in response to the change in the operating frequency. Circuit configurations defining different phase shift values for different operating frequencies may be stored in a memory (not shown), and the controller 30 may acquire a correct circuit configuration from the memory in response to the change in the operating frequency. Then, the controller 30 may input a control signal to the filter circuitry so as to apply the circuit configuration appropriate for the current operating frequency. The circuit configurations defining appropriate phase shifts for the different operating frequencies may be acquired as a result of a calibration procedure. In the calibration procedure, the appropriate phase shift compensation for the frequency drift mentioned above is determined and a corresponding circuit configuration is stored in the memory unit. The circuit configurations may be stored as predetermined digital code words so that the controller is able to apply appropriate control signals to the filter circuitry. The change of the operating frequency may be input to the controller 30 by other parts of the radio communication device, for example, or the controller 30 may continuously monitor the current operating frequency and its changes from communication parameters of the radio communication device.

In an embodiment, the feedback loop circuitry is disconnectable from the amplifier circuitry, and the controller 30 is configured to disconnect the feedback loop circuitry from the amplifier according to a determined criterion. For example, the feedback loop circuitry may be disconnected from the amplifier 22 when an interference environment is determined to be below a preset threshold level. For example, the interference level around the desired signal band may be below the threshold level and, as a consequence, the feedback loop may be disconnected. In such an interference environment, the benefit of using the feedback loop is considered low. On the other hand, the feedback loop circuitry may be connected to the amplifier 22 when an out-band interference level in the received radio signal is above the preset threshold. In such an interference environment, the benefit of using the feedback loop is considered high. Another criterion for disconnection may be optimization of power consumption. The connection and disconnection of the feedback loop circuitry from the amplifier 22 may be realized by switching the feedback loop circuitry on and off, respectively. For example, the controller 30 may switch the frequency mixers 24, 26 off when it determines to disconnect the feedback loop circuitry 20 from the amplifier 22 for example when the interference is considered to be low. When the controller decides to connect the feedback loop circuitry 20 to the amplifier 22, it may power up the frequency mixers. Instead of shutting down and powering up the frequency mixers, (an)other component(s) of the feedback loop circuitry may be switched on and off so as to effectively connect and disconnect the feedback loop circuitry 20 to and from the amplifier 22. In another embodiment, switches are added to an output and input of the feedback loop circuitry, wherein the switches are opened and closed according to a control signal provided by the controller 30. The controller 30 may be configured to open the switches, thus disconnecting the feedback loop circuitry from the amplifier, and close the switches, thus connecting the feedback loop circuitry to the amplifier, according to a given criterion.

Figure 4:
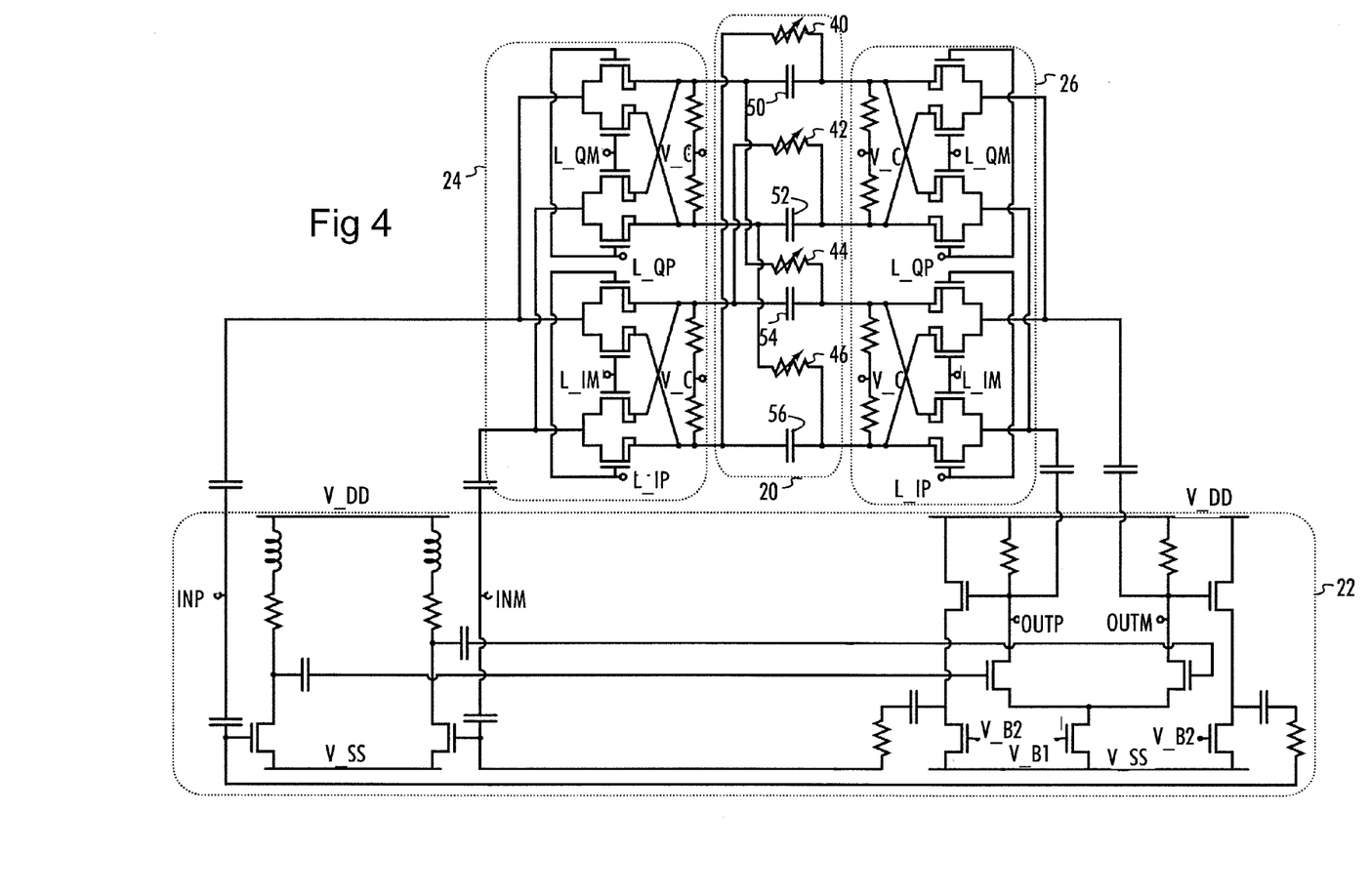
FIG. 4 illustrates a circuit diagram of an amplifier circuitry according to an embodiment of the invention.

FIG. 4 illustrates an exemplary circuit configuration for the amplifier circuitry according to an embodiment of the invention. FIG. 4 illustrates the amplifier 22 as a two-stage amplifier, although other implementations are possible. With respect to the notation in FIG. 4, positive and negative input signals of the amplifier circuitry are denoted as INP and INM, respectively, and positive and negative output signals of the amplifier circuitry are denoted as OUTP and OUTM, respectively. V_DD and V_SS denote operating voltages, and V_B1 and V_B2 bias voltages. The feedback loop circuitry is illustrated in the upper half of FIG. 4. The down-converter circuitry 26 is connected to the output of the amplifier 22 via DC-blocking capacitors. The down-converter 26 receives as input the output signal of the amplifier 22 and positive and negative components of in-phase and quadrature local oscillator signals, denoted by L_IM and L_IP for negative and positive in-phase signals and L_QM and LQP for negative and positive quadrature signals, respectively. V_C denotes a bias voltage selected according to the properties of the down-converter 26 and the up-converter 24. The down-converted signal is applied to the filter circuitry 20 comprising a capacitor 50, 52, 54, 56 for each output branch of the down-converter in FIG. 4. The capacitors 50 to 56 are configured to provide a high-pass response for the filter circuitry 20. The filter circuitry 20 additionally comprises tunable resistors 40, 42, 44, 46 forming an embodiment of the polyphase filter configuring the phase adjustment for the feedback loop. The tunable resistors 40 to 46 are disposed between the signal branches in the feedback loop and, together with the capacitors 50 to 56, they form a high-pass RC filter circuitry having tunable properties, including a tunable phase shift. Q factor of the filter circuitry may also be tuned. The resistor values of the tunable resistors 40 to 46 may be adjusted under the control of the controller 30, as described above, to achieve different phase shift values to compensate for the phase drift caused by the use of different operating frequencies. After the desired signal components are filtered out from the down-converted signal and after the phase is compensated for in the filter circuitry 20, the up-converter 24 having a structure corresponding to that of the down-converter 26 up-converts the filtered high-pass signal into a band-stop RF signal which is output from the feedback loop circuitry to the input of the amplifier 22 through DC blocking capacitors.

In the embodiment of FIG. 4, the frequency mixers 24 and 26 are passive frequency mixers but, equally, active frequency mixers may be used for the down-conversion and up-conversion.

Further referring to the embodiment of FIG. 4, the response of the filter circuitry is tuned with resistor values of the tunable resistors 40 to 46. In another embodiment, capacitance values of the capacitors 50 to 56 are also tunable, thereby providing more versatility for tuning particularly the frequency response and bandwidth of the filter circuitry. In general, the bandwidth of the filter circuitry may be made adjustable in addition to the phase shift, or as an alternative to the phase shift adjustment. With respect to the bandwidth adjustment, the adjustment of the capacitance values of the capacitors 50 to 56 may be controlled by the controller 30 by applying to the filter circuitry a control signal according to the current operating frequency of the amplifier circuitry, as described above with respect to tuning the phase shift. A tunable capacitor may be implemented by a switched capacitor topology where each capacitor 50 to 56 is replaced by a plurality of capacitors and a plurality of switches, and different capacitor circuits may be selected by closing appropriate switches controlled by signals provided by the controller 30 according to the current operating frequency and desired pass-band properties of the amplifier circuitry. In an embodiment, the bandwidth of the stopband of the filter circuitry, i.e. the passband of the amplifier circuitry, is kept constant regardless of the operating frequency. The bandwidth of the passband may be designed to be the highest bandwidth in which the amplifier circuitry operates. In another embodiment, the bandwidth of the passband is adjusted to match the current operating bandwidth.

Instead of using a first degree filter in the filter circuitry 20, as in the embodiment of FIG. 4, a higher degree filter may be used to achieve a steeper transition band and higher attenuation in the stop band. The filter circuitry 20 may be of second or third degree, for example. Additionally, other components may be provided in the feedback loop circuitry according to the desired functionality of the amplifier circuitry. For example, active components, e.g. an amplifier, may be provided in the feedback loop circuitry.

Realizing the filter circuitry with capacitors and resistors has the advantage that the use of inductors can be avoided which in practical implementations results in savings in silicon area.

Figure 5:
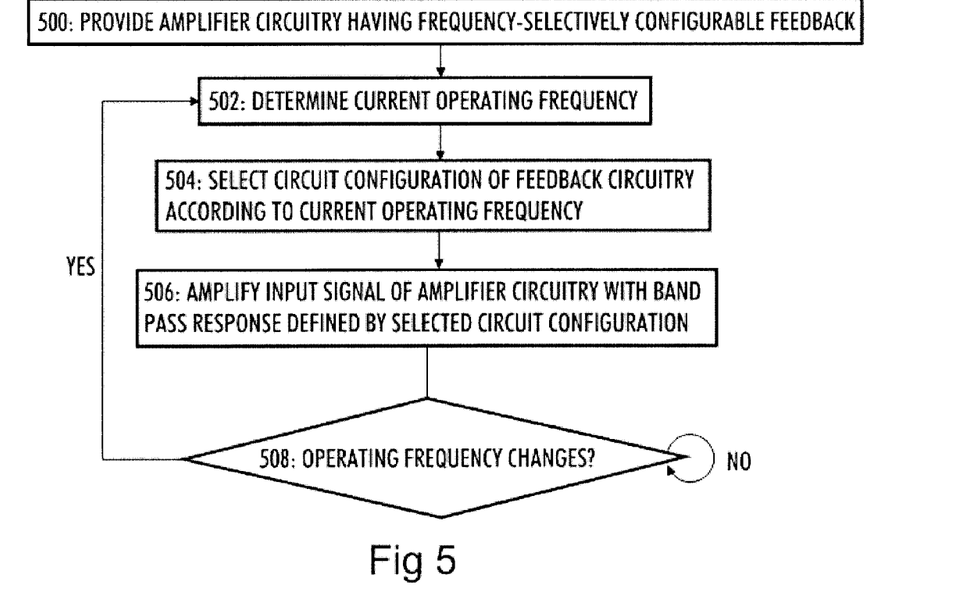
FIG. 5 is a flow diagram illustrating a method for amplifying a signal in an apparatus according to an embodiment of the invention.

FIG. 5 illustrates an embodiment of a method for configuring the amplifier circuitry according to an embodiment of the invention. Referring to FIG. 5, in block 500, the amplifier circuitry is provided. The amplifier circuitry may be any one of the embodiments described above, wherein the amplifier circuitry comprises an amplifier with a feedback loop circuitry providing a band-stop frequency response configurable selectively to one of a plurality of different supported operating frequencies and frequency bands. When the band-stop response of the feedback is subtracted from a flat response of the amplifier, the amplifier circuitry has a corresponding band-pass response.

In block 502, a current operating frequency is determined for the amplifier circuitry. For example, if the amplifier circuitry is included in a radio receiver, the current operating frequency is within the current reception frequency band of the radio receiver, e.g. GSM or UMTS frequency band. In block 504, a circuit configuration corresponding to the current operating frequency determined in block 502 is selected. In an embodiment, block 504 includes checking a memory unit for a circuit configuration mapped to the current operating frequency or frequency band and applying to the amplifier circuitry a control signal which changes the circuit configuration to tune the passband into the appropriate frequency band. The control signal may be applied to the feedback loop circuitry to adjust its circuit configuration so as to change the frequency response and/or phase shift of the feedback-loop circuitry, as described above with reference to FIGS. 2, 3A and 3B.

In block 506, the amplifier circuitry amplifies an input signal with the band-pass response according to the circuit configuration applied in block 504. In block 508, it is determined whether or not the operating frequency changes. If the operating frequency remains the same, the current circuit configuration is maintained. If the operating frequency changes, the method returns to block 502 where the new operating frequency is determined and the circuit configuration of the amplifier circuitry is selected accordingly.

Blocks 502, 504, and 508 of the method of FIG. 5 may be executed by the controller 30. The controller 30 may be realized by a digital signal processor configured by software or it may be a pure hardware component. The controller may be a multi-purpose microprocessor with one or more cores, or it may be a microcontroller. These are merely some of the possible examples of the controller and, in practice, a skilled person will select a suitable implementation of the controller according to the desired functionalities and processing power required from the controller.

In the embodiment where the controller is configured by software, blocks 502, 504, and 508 may be implemented as software modules executed in the form of a computer process defined by a computer program comprising the software modules (possibly among other software modules). The computer program may be in source code form, object code form, or in some intermediate form, and it may be stored in some sort of carrier, which may be any entity or device capable of carrying the program and readable by a computer such as the controller 30. Such carriers include a record medium, computer memory, read-only memory, electrical carrier signal, telecommunications signal, and software distribution package, for example.

It will be obvious to a person skilled in the art that, as technology advances, the inventive concept can be implemented in various ways. The invention and its embodiments are not limited to the examples described above but may vary within the scope of the claims.

The invention claimed is:

1. An apparatus comprising an amplifier with a feedback loop circuitry, wherein the feedback loop circuitry comprises:
    a first frequency converter circuitry configured to frequency-convert a signal input to the feedback loop circuitry from a first frequency to a second frequency by using a first local oscillator signal;
    a filter circuitry configured to modify the frequency-converted signal on the second frequency; and
    a second frequency converter circuitry configured to frequency-convert the modified signal from the second frequency back to the first frequency by using a second local oscillator signal and to output the frequency-converted and modified signal to be applied to an input of the amplifier,
    wherein the feedback loop circuitry implements a band-stop filter having an adjustable stopband causing the amplifier to have an adjustable band-pass response, and wherein a passband of the amplifier is changed from one operating frequency to another operating frequency by changing frequency conversion parameters of the first frequency converter circuitry and the second frequency converter circuitry.

2. The apparatus of claim 1, wherein the filter circuitry comprises a polyphase filter having an adjustable phase shift in order to achieve different phase shifts for a plurality of different operating frequencies supported by the apparatus.

3. The apparatus of claim 1, wherein the first frequency converter circuitry is a down-converter circuitry configured to down-convert the signal from a higher frequency to a lower frequency and to output the down-converted signal to the filter circuitry, wherein the filter circuitry is configured to modify the signal received from the down-converter circuitry on the lower frequency, and wherein the second frequency converter circuitry is an up-converter circuitry configured to up-convert an output signal of the filter circuitry from the lower frequency to the higher frequency and to apply the up-converted band-stop signal to the input of the amplifier.

4. The apparatus of claim 3, wherein the lower frequency is baseband and wherein the filter circuitry is configured to high-pass filter and phase-adjust the signal received from the down-converter circuitry on the baseband.

5. The apparatus of claim 3, wherein the amplifier circuitry is configured to change a passband frequency through a change in a frequency of a local oscillator signal applied to the down-converter circuitry and the up-converter circuitry.

6. The apparatus of claim 1, wherein the feedback loop circuitry is selectively disconnectable from the amplifier when an interference environment is determined to be below a preset threshold level.

7. The apparatus of claim 1, wherein the feedback loop circuitry is inherently passive in terms of amplification of the signal applied to the feedback loop circuitry.

8. The apparatus of claim 1, wherein the apparatus is applicable to a radio communication device and further comprises a controller configured to change a circuit configuration of the feedback loop circuitry in response to a change in an operating frequency of the radio communication device.

9. The apparatus of claim 8, wherein the controller is further configured to change a frequency of a local oscillator signal of the up-converter circuitry and the down-converter circuitry and to change the phase configuration of the polyphase filter in response to the change in the operating frequency of the radio communication device.

10. The apparatus of claim 8, wherein the controller is further configured to disconnect the feedback loop circuitry from the amplifier when an interference environment is determined to be below a preset threshold level.

11. The apparatus of claim 1, wherein the apparatus is a radio communication device further comprising a controller configured to control the operation of the radio communication device and a memory unit including computer program code configuring the operation of the controller.

12. A method, comprising:
    providing an amplifier circuitry comprising an amplifier with a feedback loop circuitry, the feedback loop circuitry comprising a first frequency converter circuitry, a filter circuitry, and a second frequency converter circuitry, wherein the feedback loop circuitry implements a band-stop filter having an adjustable stopband causing the amplifier circuitry to have an adjustable band-pass response;
    frequency-converting, in the first frequency converter circuitry comprised in the feedback loop circuitry, a signal input to the feedback loop circuitry from a first frequency to a second frequency by using a first local oscillator signal;
    modifying the frequency-converted signal on the second frequency in the filter circuitry;
    frequency-converting, in the second frequency converter circuitry, the modified signal from the second frequency back to the first frequency by using a second local oscillator signal;
    inputting the frequency-converted and modified signal to an input of the amplifier; and
    changing a passband of the amplifier circuitry from one operating frequency to another operating frequency by changing frequency conversion parameters of the first frequency converter circuitry and the second frequency converter circuitry.

13. The method of claim 12, further comprising:
selecting, on the basis of a current operating frequency, a circuit configuration for a polyphase filter comprised in the filter circuitry in order to achieve desired phase shift properties among a plurality of different phase shifts associated with a plurality of supported operating frequencies; and
configuring the polyphase filter to apply the selected circuit configuration in order to achieve the desired phase shift for the current operating frequency.

14. The method of claim 12, wherein the first frequency converter circuitry is a down-converter circuitry and the second frequency converter circuitry is an up-converter circuitry, the method further comprising:
down-converting, in the down-converter circuitry, a signal applied to an input of the feedback loop circuitry from a radio frequency to a lower frequency;
modifying, in the filter circuitry, the down-converted signal received from the down-converter on the lower frequency; and
up-converting, in the up-converter circuitry, the filtered and phase-compensated signal from the lower frequency to the higher frequency, and applying the up-converted band-stop signal to the input of the amplifier.

15. The method of claim 14, wherein the lower frequency is baseband, wherein the filtering is carried out as high-pass filtering, and wherein the high-pass filtering and phase-adjustment are carried out on the baseband.

16. The method of claim 14, further comprising:
changing the passband frequency of the amplifier circuitry by changing a frequency of a local oscillator signal applied to the down-converter circuitry and the up-converter circuitry.

17. The method of claim 12, further comprising:
disconnecting the feedback loop circuitry from the amplifier or connecting the feedback loop circuitry to the amplifier on the basis of an interference environment determined to be below a preset threshold level.

18. The method of claim 12, wherein the amplifier circuitry is applied to a radio communication device and wherein the method further comprises changing a circuit configuration of the feedback loop circuitry in response to a change in an operating frequency of the radio communication device.

19. A method comprising:
selecting, on the basis of an operating frequency to be applied, a circuit configuration for a feedback loop circuitry of an amplifier circuitry comprising an amplifier with the feedback loop circuitry, the feedback loop circuitry comprising a first frequency converter circuitry configured to frequency-convert a signal input to the feedback loop circuitry from a first frequency to a second frequency by using a first local oscillator signal; a filter circuitry configured to modify the frequency-converted signal on the second frequency; and a second frequency converter circuitry configured to frequency-convert the modified signal from the second frequency back to the first frequency by using a second local oscillator signal and to output the frequency-converted and modified signal to be applied to an input of the amplifier, wherein the feedback loop circuitry implements a band-stop filter having an adjustable stopband causing the amplifier circuitry to have an adjustable band-pass response, and wherein a passband of the amplifier circuitry is changed from one operating frequency to another operating frequency by changing frequency conversion parameters of the first frequency converter circuitry and the second frequency converter circuitry; and
configuring the first frequency converter circuitry and the second frequency converter circuitry to apply the selected circuit configuration and to have frequency conversion parameters associated with the operating frequency to be applied.

20. An apparatus comprising a controller circuitry configured to:
select, on the basis of an operating frequency to be applied, a circuit configuration for a feedback loop circuitry of an amplifier circuitry comprising an amplifier with the feedback loop circuitry, the feedback loop circuitry comprising a first frequency converter circuitry configured to frequency-convert a signal input to the feedback loop circuitry from a first frequency to a second frequency by using a first local oscillator signal; a filter circuitry configured to modify the frequency-converted signal on the second frequency; and a second frequency converter circuitry configured to frequency-convert the modified signal from the second frequency back to the first frequency by using a second local oscillator signal and to output the frequency-converted and modified signal to be applied to an input of the amplifier, wherein the feedback loop circuitry implements a band-stop filter having an adjustable stopband causing the amplifier circuitry to have an adjustable band-pass response, and wherein a passband of the amplifier circuitry is changed from one operating frequency to another operating frequency by changing frequency conversion parameters of the first frequency converter circuitry and the second frequency converter circuitry; and
configure the first frequency converter circuitry and the second frequency converter circuitry to apply the selected circuit configuration and to have frequency conversion parameters associated with the operating frequency to be applied.

\* \* \* \* \*